United States Patent [19]

Bronstert et al.

[11] 4,387,157
[45] Jun. 7, 1983

[54] PHOTOSENSITIVE MULTI-LAYER MATERIAL AND PREPARATION OF ADHESIVE LAYERS EMPLOYED THEREIN

[75] Inventors: Bernd Bronstert, Frankenthal; Herbert Hahn, Ludwigshafen; Gerhard Hoffmann, Otterstadt; Werner Lenz, Bad Durkheim, all of Fed. Rep. of Germany

[73] Assignee: BASF Aktiengesellschaft, Fed. Rep. of Germany

[21] Appl. No.: 324,278

[22] Filed: Nov. 23, 1981

[30] Foreign Application Priority Data

Dec. 3, 1980 [DE] Fed. Rep. of Germany ....... 3045516

[51] Int. Cl.$^3$ ................................................. G03C 1/78
[52] U.S. Cl. ..................................... 430/271; 430/275; 430/276; 430/281; 430/906
[58] Field of Search ............... 430/271, 275, 276, 281, 430/906

[56] References Cited

FOREIGN PATENT DOCUMENTS 1597515 10/1967 Fed. Rep. of Germany .
2202357 1/1972 Fed. Rep. of Germany .

OTHER PUBLICATIONS

P. Nylen, E. Sunderland: "Modern Surface Coatings," Interscience Publishers, London–New York–Sydney 1965, Section 13.42, pp. 461–473.

Primary Examiner—Jack P. Brammer
Attorney, Agent, or Firm—Keil & Witherspoon

[57] ABSTRACT

A photosensitive multi-layer material comprising a base and a photosensitive layer which has a polyamide binder and is soluble or dispersible in an alcoholic solvent contains two layers between the base and the photosensitive layer, namely (a) an adhesion-promoting layer, adjacent to the base, which is derived from a polyurethane binder, prepared by reacting a hydroxyl-containing epoxy resin and a polyisocyanate, and a pigment combination in which a white zinc sulfide pigment is the essential constituent, and (b) an adhesive layer, adjacent to the photosensitive layer, which consists of a baked mixture of an alcohol-soluble copolyamide and a melamine-formaldehyde resin.

6 Claims, No Drawings

PHOTOSENSITIVE MULTI-LAYER MATERIAL AND PREPARATION OF ADHESIVE LAYERS EMPLOYED THEREIN

The present invention relates to a photosensitive multi-layer material which possesses special adhesive layers between a base and a photosensitive layer of a polyamide binder and photopolymerizable ethylenically unsaturated compounds, and to a process for the preparation of such adhesive layers.

It is known, for example from German Laid-Open Application DOS No. 1,597,515, to use an adhesion-promoting layer (APL) comprising a hydroxyl-containing binder and a polyisocyanate in order to improve the adhesion of a photosensitive layer to a base. Moreover, it is known from U.S. Pat. No. 3,861,921 that, in order to further improve adhesion, an adhesive layer (AL) may be applied to the adhesion-promoting layer, and that a mixture of a hardenable phenol-formaldehyde resin and an alcohol-soluble polyamide binder can be used for this purpose, this mixture being baked, ie. hardened. Frequently, relief printing plates produced from such multi-layer materials exhibit relief areas with convex sidewalls, especially in the case of isolated dots and fine lines, which are consequently poorly anchored to the base. Thus, Japanese characters are often difficult to print satisfactorily with such plates. Moreover, the long exposure times required to prevent undercutting of the relief when developing the relief plates by washout are an unsatisfactory feature.

It is an object of the present invention to improve photosensitive multi-layer materials for the production of relief plates by modifying the adhesive layers so that, without deterioration of the adhesive properties, an improved relief image and improved anchorage of isolated dots (ie. having a good sloping base support) results when these multi-layer materials are processed by conventional methods to give relief plates and in particular relief printing plates.

We have found that this object is achieved if the base B is first coated with a solution of reactive adhesive-forming compounds which contains, as solids, an epoxy resin binder having a mean molecular weight of from 900 to 25,000 and a hydroxyl content of from 4 to 8% by weight, from 0.8 to twice the equivalent amount of polyisocyanate, and a pigment combination comprising a predominant amount of a white zinc sulfide pigment, of which up to 50% by weight can be replaced by magnesium oxide, with a minor amount of a white titanium dioxide pigment and preferably a chrome oxide green pigment, and, after drying and baking the layer of solution to give the adhesion-promoting layer APL, a layer of a hardenable mixture is applied which consists essentially of from 65 to 98% by weight of an alcohol-soluble copolyamide and from 2 to 35% by weight of an alcohol-etherified melamine-formaldehyde condensate having a mean molecular weight of from 300 to 1,800, the hardenable mixture being baked, before the photosensitive relief-forming layer R is applied, to give the adhesive layer AL.

The invention relates not only to the process for the preparation of the adhesive layers of such a multilayer material, but also to a photosensitive multi-layer material which possesses
  (a) between the base B and
  (b) a photosensitive layer R of a mixture—which is soluble or dispersible in an alcoholic solvent and contains a photoinitiator—of at least one polyamide binder and at least one photopolymerizable ethylenically unsaturated compound compatible therewith,
  (c) a pigmented adhesion-promoting layer APL adjacent to the base B and containing a reaction product of a hydroxyl-containing binder with a polyisocyanate, and
  (d) an adhesion layer AL adjacent to the photosensitive layer R and consisting essentially of a baked mixture of a polyamide binder, which is compatible with the polyamide binder of layer R, and a hardenable formaldehyde resin, wherein
  (A) the adhesion-promoting layer APL is prepared by applying, drying and baking a solution of reactive adhesive-forming compounds which contains, as solids
    (A1) from 20 to 60% by weight, based on the amount of solids (A1)–(A4), of an epoxy resin binder having a mean molecular weight of from 900 to 25,000 and a hydroxyl content of from 4 to 8% by weight,
    (A2) from 0.8 to 2 equivalents, per equivalent of hydroxyl groups of (A1), of a polyisocyanate,
    (A3) from 15 to 35% by weight, based on the amount of solids (A1)–(A4), of a pigment combination of
      (A3.1) a white zinc sulfide pigment of which up to 50% by weight can be replaced by magnesium oxide,
      (A3.2) from 0.05 to 10% by weight, based on the pigment combination (A3), of a white titanium dioxide pigment and
      (A3.3) from 0 to 10% by weight, based on the pigment combination (A3), of a chrome oxide green pigment, and
    (A4) from 0 to 25% by weight, based on the amount of solids (A1)–(A4), of at least one extender, and
  (B) the adhesive layer AL consists essentially of a baked mixture of
    (B1) from 65 to 98% by weight of an alcohol-soluble copolyamide and
    (B2) from 2 to 35% by weight of a hardenable alcohol-etherified melamine-formaldehyde condensate having a mean molecular weight of from 300 to 1,800.

Preferred dimensionally stable bases B are made of metal, eg. steel sheet or aluminum sheet of the conventional thicknesses. The steel sheet can carry a tin, chromium or nickel layer. Acid-degreased and subsequently phosphatized or chromatized steel sheet, and degreased and subsequently chromatized aluminum sheet are preferred. For some uses, dimensionally stable plastic films, such as polyester films, may also be used as the base.

The photosensitive layer R, or photopolymer layer, of the novel multi-layer materials consists essentially of a mixture—which is soluble or dispersible in an alcoholic solvent and contains a photoinitiator—of at least one polyamide binder and at least one photopolymerizable ethylenically unsaturated compound compatible therewith. Examples of suitable polyamide binders are alcohol-soluble copolymers as described, for example, in French Pat. No. 1,520,856 or German Laid-Open Application DOS No. 2,202,357, of which the corresponding unexposed polyamide-monomer mixture can be washed out with an aqueous alcohol, such as aqueous ethanol or aqueous propanol.

Particularly suitable photopolymerizable ethylenically unsaturated compounds for use in the layer R are low molecular weight compounds having at least one ethylenically unsaturated photopolymerizable double bond, provided they form compatible mixtures with the chosen polymeric binder and provided they have a boiling point of above 100° C. at atmospheric pressure. Preferably, monomers having two or more ethylenically unsaturated photopolymerizable double bonds are used, by themselves or as a mixture with monomers having only one such double bond.

Suitable monomers include diacrylates, polyacrylates, dimethacrylates and polymethacrylates, such as are obtained by esterifying diols or polyols with acrylic acid or methacrylic acid, eg. the diacrylates, triacrylates, dimethacrylates and trimethacrylates of ethylene glycol, diethylene glycol, triethylene glycol, polyethylene glycol having a molecular weight of up to about 500, propane-1,2-diol, propane-1,3-diol, neopentyl glycol (2,2-dimethyl-propanediol), butane-1,4-diol, 1,1,1-trimethylolpropane, glycerol or pentaerythritol, and in particular monomers which in addition to the double bonds contain amide groups and/or urethane groups, such as derivatives of acrylamides, eg. the reaction product of 2 moles of N-hydroxymethylacrylamide or N-hydroxymethylmethacrylamide with 1 mol of an aliphatic diol, such as ethylene glycol, xylylene-bis-acrylamide or alkylene-bisacrylamides, where alkylene is of 1 to 8 carbon atoms. The ratio of monomer to polymeric binder in the mixture can be varied within wide limits; preferably, the mixture contains from 10 to 55, especially from 25 to 50, % by weight of monomers and from 45 to 90, especially from 50 to 75, % by weight of polymeric binders, based on the sum of the amounts of monomers and polymeric binders. In general, the layers R are solid at room temperature.

The amount of photoinitiator used depends on the extinction coefficient of the latter and on the thickness of the layer of materials being hardened, and is in general from 0.01 to 15% by weight, especially from about 0.01 to 5% by weight, of the total amount of the layer R. Suitable photoinitiators are virtually all compounds which can, on exposure to actinic light, form free radicals which initiate polymerization, for example acyloins and acyloin-ethers, aromatic diketones and their derivatives, polynuclear quinones, acridine derivatives, phenazine derivatives or benzoyl-phosphine oxides. Very suitable compounds include benzoin and α-hydroxymethylbenzoin, their alkyl ethers, alkyl being of 1 to 8 carbon atoms, eg. benzoin isopropyl ether, α-hydroxymethylbenzoin methyl ether, benzoin tetrahydropyranyl ether and benzoin methyl ether, and benzil monoketals, eg. benzil monomethyl-benzyl ketal and benzil mono-neopentyl ketal.

The mixture constituting the layer R can also contain other conventional additives, such as plasticizers, saturated low molecular compounds containing amide groups, waxes, activators, thermal polymerization inhibitors and the like, in conventional amounts.

The novel adhesion-promoting layer APL adjacent to the base B is prepared by applying and drying and baking a solution of reactive adhesive-forming compounds and generally has a final thickness of from 3 to 100 μm, preferably from 5 to 30 μm. Preferred epoxy resin binders having a mean molecular weight of from 900 to 25,000 and especially from 3,000 to 11,000 and a hydroxyl content of from 4 to 8, especially from 4.5 to 7.2, % by weight are linear epoxy resins which are soluble in organic solvents and contain aromatic groups in their chain, in particular hydroxyl-containing products prepared from bisphenol A and epichlorohydrin. Specific examples are a commercial epoxy resin prepared from bisphenol A and epichlorohydrin and having an epoxide equivalent of about 0.055 (based on 100 g of resin), an OH content of 6.1% by weight and a molecular weight of 2,900; an epoxy resin, prepared from the same components and having an epoxide equivalent of about 0.03 (based on 100 g of resin), an OH content of 6.8% by weight and a molecular weight of from 3,700 to 3,800; and a similar commercial product having an epoxide equivalent of from 0.02 to 0.04 (based on 100 g of resin), an OH content of from 5.2 to 5.5% by weight, and a molecular weight of from about 5,500 to 9,000.

The amount of epoxy resin binder in the said solution is advantageously from 20 to 60, and especially from 25 to 45, % by weight, based on the sum of the solids (A1)–(A4).

Suitable polyisocyanates (A2) for forming a polyurethane, ie. for use as hardeners of the binder (A1), are free or blocked polyisocyanates, as well as compounds which eliminate isocyanates (cf., for example, Houben-Weyl, Methoden der organischen Chemie, 4th edition, volume XIV/2, page 61, G. Thieme Verlag, Stuttgart 1963), preferably polyisocyanates containing 2 or more isocyanate groups bonded to an aromatic structure. Specific examples are toluylene 2,4/2,6-diisocyanate (TDI), as the free isocyanate or blocked, for example, with phenol; diphenylmethane 4,4'-diisocyanate (MDI); naphthylene 1,5-diisocyanate (NDI); 3,3'-dimethyldiphenyl 4,4'-diisocyanate (TODI); a reaction product of 3 moles of toluylene diisocyanate (TDI) with 1 mole of 1,1,1-trimethylolpropane in the form of the free triisocyanate or blocked with, for example, methyl ethyl ketoxime or dibutyl malonate; a reaction production of 3 moles of TDI with 1 mole of thiophosphoric acid; triphenylmethane triisocyanate; the dimer of toluylene diisocyanate; and oligomers of 5 moles or 7 moles of toluylene diisocyanate, respectively containing 2 and 3 isocyanurate rings.

For reaction with the binder (A1), from 0.8 to 2, preferably from 1 to 1.3, equivalents of isocyanate are employed per equivalent of hydroxyl groups in the binder (A1).

The solution used, according to the invention, to produce the adhesion-promoting layer APL moreover contains from 15 to 35, especially from 15 to 25, % by weight, based on the sum of the solids (A1) to (A4), of a pigment combination which preferably contains more than 90% by weight of a white zinc sulfide pigment (such as zinc sulfide (sic) or, preferably, lithopone), of which up to 50% by weight, especially up to 20% by weight, can be replaced by magnesium oxide, from 0.05 to 10, especially from 1.5 to 4, % by weight of white titanium dioxide pigment, eg. rutile or anatase, and from 0 to 10, especially from 2 to 4.5, % by weight of chrome oxide green pigment. A very suitable pigment combination consists, for example, of about 94% by weight of lithopone (containing 60% by weight of zinc sulfide), about 2% by weight of rutile and about 4% by weight of chrome oxide green. It has proved very advantageous to employ a weight ratio of epoxy resin binder (A1) to pigment combination (A3) of from 1:1 to 2:1 and especially from about 1.4:1 to 1.6:1.

The solution can furthermore contain up to 25% by weight, based on solids (A1)–(A4), of an extender or extender mixture (A4). An extender content of from 10 to 20, especially from 14 to 16, % by weight has proved advantageous. For a definition of extenders, reference may be made to P. Nylen and E. Sunderland, Modern Surface Coatings, Interscience Publishers, London-New York-Sydney 1965, Section 13.42, pages 461–473, and to DIN 55,945. They differ from the pigments (A3) in particular in respect of their low refractive index and their low hiding power. Particularly suitable extenders have proved to be talc and bentonite, as well as the commercial modified bentonites obtained by cation exchange between bentonites and organic ammonium bases.

Further suitable additives for use in the solution used to produce the adhesion-promoting layer APL are conventional dispersants and anti-settling agents. If desired, conventional catalysts for polyisocyanate hardening can be used, when preparing the adhesion-promoting layer APL, to accelerate the hardening and anchoring of the said layer. Examples of such accelerators are tertiary amines, added in amounts of about 0.005–1% by weight, as well as heavy metal salts, eg. tin salts and zinc salts, of monocarboxylic acids, which are added in amounts of about 0.001–1% by weight, the percentages being based on solids content in the solution.

The adhesion-promoting layer APL is prepared from a solution of the solids compomcents and reactants in a solvent. Suitable solvents for this purpose are mixtures of aromatic solvents, eg. toluene, xylene or cumene; glycol esters, eg. methylglycol acetate, ethylglycol acetate and butylglycol acetate; glycol ethers, eg. diglycol dimethyl ether; esters, eg. butyl acetate, amyl acetate and 3-methoxybutyl acetate; and ketones, eg. methyl ethyl ketone, methyl isobutyl ketone, diisobutyl ketone, cyclohexanone and diacetone-alcohol.

To prepare the adhesion-promoting layer APL according to the invention, the said solution is applied to an appropriately pretreated base B in an amount which gives a dry coating which is 3–100 $\mu$m, preferably 5–30 $\mu$m, thick. Coating can be effected by one of the conventional methods such as brushing, spraying, dipping, casting or roller-coating. Thereafter, the coating is dried and baked at from 50° to 300° C., preferably from 100° to 230° C., for a period of from one minute to several hours, preferably for 2–60 minutes, the conditions chosen depending on the type of base. The drying and baking can, for example, be carried out in a suitable through-circulation cabinet dryer. Before baking, the coating is advantageously pre-dried by leaving it for 2–60 minutes at from room temperature to 100° C.

An adhesive layer AL is then applied to provide a good bond between the layer APL and the photosensitive monomer-polymer layer R. According to the invention, suitable materials for the preparation of the adhesive layer AL consist essentially of hardenable mixtures of (B1) from 65 to 98, especially from 80 to 92, % by weight of an alcohol-soluble copolyamide which is compatible with the polyamide binder of the layer R, and (B2) from 2 to 35, especially from 8 to 20, % by weight of a hardenable alcohol-etherified melamine-formaldehyde condensate having a mean molecular weight of from 300 to 1,800 and especially from 300 to 1,200. Advantageously, the copolyamide used is one of those mentioned above for use in the relief-forming photosensitive layer R. Preferably, the copolyamide used for the adhesive layer AL is the same as, or structurally very similar to, that used for the layer R. Particularly suitable hardenable alcohol-etherified melamine-formaldehyde condensates of the molecular weight mentioned are commercial products prepared by acid condensation of melamine with excess formaldehyde in the presence of a lower alcohol, or by etherification or trans-etherification of a polyfunctional methylolmelamine condensate. Melamine-formaldehyde condensates etherified with $C_1$–$C_4$-alkanols have proved particularly suitable. Acids, for example formic acid or acetic acid, and compounds which eliminate acid can be added to accelerate the hardening.

To prepare the adhesive layer AL, the mixture is preferably applied as a 15–25% strength solution (for example in propanol/water) in an amount which gives a dry coating thickness of 7–50 $\mu$m. Pre-drying of the layer can be carried out as for the preparation of the adhesion-promoting layer APL; baking is preferably carried out at 90°–230° C., for from 3 to 60 minutes, the conditions depending on the type of base.

As the next step in the preparation of the novel photosensitive multi-layer material, the photopolymer layer R is applied to the base B provided with the novel adhesion-promoting layer APL and the adhesive layer AL; advantageously, the photopolymer layer R is applied by laminating, preferably using a propanol-water mixture as laminating aid. The multi-layer materials obtained exhibit excellent adhesion of the photopolymer layer R to the base B; moreover, when they are processed into relief printing plates, isolated dots and other fine relief image sections are firmly supported on the base, and have a particularly advantageous sidewall structure, which results in very good printed copies.

The novel multi-layer material is particularly suitable for the production of relief plates or relief printing plates. For example, sheets of the material can be processed into printing plates in a conventional manner, by exposing them imagewise (after optional overall exposure thereof which does not cause crosslinking of the photosensitive layer R) through a suitable negative, developing the relief by washing out the unexpected areas with a suitable solvent mixture, drying them and, if necessary, post-exposing them over their entire surface. The conventional light sources which emit actinic rays, such as carbon arc lamps, mercury vapor lamps, xenon lamps or fluorescent tubes, can be used for preexposure, imagewise exposure and postexposure. The relief can be developed by spraying the exposed multi-layer material with a solvent, using a suitable nozzle system, or by rubbing the exposed material, in a solvent, with velvet or suitable brushes (mounted on rotating and/or oscillating discs, rollers or belts). The most advantageous method of drying the plates is by a hot air blower and/or by exposure to infrared radiation.

In the following Examples which illustrate the invention, and the Comparative Experiments, parts and percentages are by weight, unless stated otherwise.

EXAMPLE 1

1.1 Preparation of the adhesion-promoting layer APL 243 parts of a commercial epoxy resin (prepared from bisphenol A and epichlorohydrin), having an epoxide equivalent of about 0.02 (based on 100 g of resin), a molecular weight of about 5,500 and an OH content of 5.9% (component (A1)) and 147 parts of finely divided lithopone (containing 60% of ZnS), 3 parts of finely divided rutile, 6 parts of finely divided chrome oxide green, 90 parts of talc and 20 parts of a commercial paste of a bentonite which has been modified with an organic ammonium base (Bentone ® from National Lead Co.) are milled for 2 days with butyl acetate, ethylglycol acetate and xylene in a ball mill.

The resulting composition is mixed with 346 parts of a commercial reaction product (serving as the polyisocyanate) of 1 mole of 1,1,1-trimethylolpropane and 3 moles of toluylene diisocyanate and are introduced, as a 75% strength solution in a 1:1 xylene/ethylglycol acetate mixture.

A layer of the resulting mixture is cast on an aluminum sheet, allowed to stand in the air for 1 hour at room temperature and then baked for 5 minutes in a through-circulation cabinet dryer at 180° C. The resulting dry adhesion-promoting layer APL is about 18 μm thick.

1.2 Preparation of the adhesive layer AL 341 parts of a copolyamide of about equal parts of hexamethylenediammonium adipate, 4,4'-diammoniumdicyclohexylmethane adipate and ε-caprolactam, having a K value (as defined by Fikentscher, Celluloschemie 13 (1932), 58) of 67, and 65 parts of a commercial hardenable methanol-etherified melamine-formaldehyde condensate (prepared by reacting melamine with excess formaldehyde in the presence of methanol in a slightly acidic medium, and having a mean molecular weight of about 400) are dissolved in alcohol at 50° C. A knife coater is used to apply a layer of this solution to the base, carrying the adhesion-promoting layer APL, so as to give a dry coating thickness of about 8 μm. After standing in the air for about 30 minutes at room temperature, the layer is baked for 4 minutes in a through-circulation cabinet dryer.

1.3 Application of the photosensitive layer R 0.3% of the potassium salt of N-nitrosocyclohexylhydroxylamine, 0.01% of a black dye (Color Index No. 12,195) and 0.03% of 2-butylthio-2-anthraquinone are added to a 65% strength solution of a mixture of 60% of the copolyamide mentioned under 1.2, 25% of the diether of 1 mole of ethylene glycol and 2 moles of N-hydroxymethylacrylamide, 13.5% of benzenesulfonamide and 1.5% of benzoin tetrahydropyranyl ether. A layer of the solution is cast onto the aluminum sheet, provided with the layers described in 1.1 and 1.2, so that after drying at about 70° C. a photosensitive layer R which is 680 μm thick results.

1.4 Testing the multi-layer material

The multi-layer material is exposed imagewise through a negative and the minimum exposure time required to produce a firmly supported dot 200 μm in diameter is determined. It is found to be 3.5 minutes. The base angle α (measured between the adhesive layer AL and the tangent to the dot at the base of the dot), and the shoulder angle β (measured between the plane of the printing surface and the tangent to the dot at the point of intersection with the said plane) for an isolated dot having a printing surface diameter of 200 μm are respectively 90° and 59±2°. For adequate support of isolated dots, 90° is the minimum desirable base angle α.

EXAMPLE 2

The procedure described in Example 1 is followed, except that the photosensitive layer R contains a reaction product of 1 mole of toluylene diisocyanate with 2 moles of 2-hydroxyethyl methacrylate, in place of benzenesulfonamide. The minimum exposure time, as defined in 1.4, is 10 minutes, the base angle is about 90° and the shoulder angle 59±2°.

COMPARATIVE EXPERIMENT 1

The procedure described is exactly as in Example 1, except that, in the preparation of the adhesive layer AL according to 1.2, the melamine-formaldehyde resin is replaced by an equal amount of a hardenable phenolic resin (prepared by condensing 30 parts of phenol and 7.5 parts of bisphenol A with excess formaldehyde at 100° C. in the presence of dimethylethanolamine).

The minimum exposure time, as defined in 1.4, is 4.5 minutes, and the base angle is about 90° C.

If the exposure time is reduced to 3.5 minutes, as in Example 1, the base angle is 78° and the shoulder angle 59±2°. This base angle of 78° no longer provides adequate support for 200 μm dots.

COMPARATIVE EXPERIMENT 2

The procedure described in Example 2 is followed, except that a hardenable mixture containing phenolic resin is applied, as in Comparative Experiment 1.

The minimum exposure time, as defined in 1.4, is 14 minutes, and the base angle is about 90°.

If the exposure time is reduced to 10 minutes, as in Example 2, the base angle is about 78° and the shoulder angle 59±2°.

COMPARATIVE EXPERIMENT 3

The procedure described in Example 1 is followed, except that, as in Comparative Experiment 1, a hardenable mixture containing phenolic resin is used to produce the adhesive layer AL, and that the composition used in the preparation of the adhesion-promoting layer APL contains, in place of the epoxy resin, an equal amount of a commercial hydroxyl-containing branched polyester (OH number about 290, mean molecular weight about 800), and rutile instead of lithopone, the total amount of pigment being the same. To this composition are added 400 parts of a commercial reaction product (serving as the polyisocyanate) of 1 mole of 1,1,1-trimethylolpropane and 3 moles of toluylene diisocyanate, in the form of a 75% strength solution in a 1:1 mixture of xylene and ethylglycol acetate.

The minimum exposure time, as defined in 1.4, is 6 minutes and the base angle is about 90°.

If the exposure time is reduced to 3.5 minutes, as in Example 1, the base angle is about 70° and the shoulder angle 59±2°.

COMPARATIVE EXPERIMENT 4

The procedure described in Example 2 is followed, except that, as in Comparative Experiment 1, a hardenable mixture containing phenolic resin is used to produce the adhesive layer AL, and that the mixture described in Comparative Experiment 3 is used to prepare the adhesion-promoting layer APL.

The minimum exposure time, as defined in 1.4, is 17 minutes and the base angle is about 90°.

If the exposure time is reduced to 10 minutes, as in Example 2, the base angle is about 70° and the shoulder angle 59±2°.

We claim:

1. A photosensitive multi-layer material which comprises the following layers, in the stated sequence:
   (a) a base B, (b) a pigmented adhesion-promoting layer APL prepared by baking a solution of reactive adhesive-forming compounds which contains, as solids:
 (A1) from 20 to 60% by weight, based on the amount of solids (A1)–(A4), of an epoxy resin binder having a mean molecular weight of from 900 to 25,000 and a hydroxyl content of from 4 to 8% by weight,
 (A2) from 0.8 to 2 equivalents, per equivalent of hydroxyl groups of (A1), of a polyisocyanate,
 (A3) from 15 to 35% by weight, based on the amount of solids (A1)–(A4), of a pigment combination of
  (A3.1) a white zinc sulfide pigment of which up to 50% by weight can be replaced by magnesium oxide,
  (A3.2) from 0.05 to 10% by weight, based on the pigment combination (A3), of a white titanium dioxide pigment and
  (A3.3) from 0 to 10% by weight, based on the pigment combination (A3), of a chrome oxide green pigment, and
 (A4) from 0 to 25% by weight, based on the amount of solids (A1)–(A4), of at least one extender;
(c) an adhesive layer AL consisting essentially of a baked mixture of
 (B1) from 65 to 98% by weight of an alcohol-soluble copolyamide which is compatible with the polyamide binder of the subsequent photosensitive layer R and
 (B2) from 2 to 35% by weight of a hardenable, alcohol-etherified melamine-formaldehyde condensate having a mean molecular weight of from 300 to 1,800; and
(d) a photosensitive layer R consisting of a mixture which contains at least one polyamide binder, at least one photopolymerizable ethylenically unsaturated low molecular weight compound compatible therewith and at least one photoinitiator, the mixture being soluble or dispersible in an alcoholic solvent.

2. A photosensitive multi-layer material as defined in claim 1, wherein the pigment combination (A3) contains lithopone as the white zinc sulphide pigment.

3. A photosensitive multi-layer material as defined in claim 2, wherein the pigment combination (A3) contains more than 90% by weight of lithopone which has a zinc sulfide content of 60% by weight.

4. A photosensitive multi-layer material as defined in claim 1, wherein the weight ratio of epoxy resin binder (A1) to pigment combination (A3) is from 1:1 to 2:1.

5. A photosensitive multi-layer material as defined in claim 1, wherein the amount of extender (A4) is from 10 to 20% by weight, based on the total amount of solids (A1)–(A4).

6. A photosensitive multi-layer material as defined in claim 5, wherein the extender (A4) predominantly consists of talc.

* * * * *